United States Patent [19]

Potter

[11] 3,980,867

[45] Sept. 14, 1976

[54] TRAFFIC SIGNAL LOOP MONITORING SYSTEM

[75] Inventor: Thomas R. Potter, Los Alamitos, Calif.

[73] Assignee: Indicator Controls Corporation, Gardena, Calif.

[22] Filed: Dec. 19, 1974

[21] Appl. No.: 534,634

[52] U.S. Cl. .................... 235/92 TC; 235/92 TF; 235/92 CA; 235/92 R; 340/38 R; 340/248 D
[51] Int. Cl.² .................................. H03K 21/30
[58] Field of Search ......... 235/92 T, 92 TF, 92 CA, 235/92 PE, 92 TC, 92 CT, 92 DN, 92 MT; 340/248 R, 248 D, 248 E, 38 R

[56] References Cited
UNITED STATES PATENTS

| | | | |
|---|---|---|---|
| 2,601,472 | 6/1952 | Van Weel | 340/248 D |
| 3,164,802 | 1/1965 | Kleist et al. | 235/92 TC |
| 3,564,219 | 2/1971 | Mutziger | 235/92 PE |
| 3,581,068 | 5/1971 | Wyatt | 328/44 |
| 3,614,729 | 10/1971 | Fujimoto et al. | 340/38 R |
| 3,652,832 | 3/1972 | Baumann | 235/92 EV |
| 3,663,938 | 5/1972 | Baer | 235/92 T |

Primary Examiner—Gareth D. Shaw
Assistant Examiner—John P. Vandenburg
Attorney, Agent, or Firm—Jessup & Beecher

[57] ABSTRACT

A monitoring system is provided for use in conjunction with a wire loop which is embedded in a roadway, and which senses the presence of vehicles in the roadway to control a traffic signal. The monitoring system senses the output of the loop oscillator which is included in the traffic control circuitry and which generates a loop signal and whose frequency-determining circuit includes the wire loop to indicate immediately any failure in the loop circuit. If for any reason the loop oscillator fails to operate, that fact will be sensed immediately by the monitoring system of the invention, and such a failure will be equated to a failure in the embedded loop, or in the lead-in circuit which connects the loop to the loop oscillator. A digital embodiment of the monitoring system of the invention includes a reference oscillator which generates a reference signal whose frequency is lower than the frequency of the loop signal, and it also includes a two-count binary counter which is clocked by the reference signal, and which is cleared by the loop signal so that the counter cannot exceed a count of one, so long as the loop oscillator is functioning. However, should the loop oscillator fail, indicating a failure condition in the loop, the counter will then proceed to the count of two, and that count will set a flip-flop to activate an appropriate indicator. The flip-flop will remain set and the indicator activated, until reset by appropriate manual means. An analog embodiment of the monitoring system of the invention is also provided.

12 Claims, 2 Drawing Figures

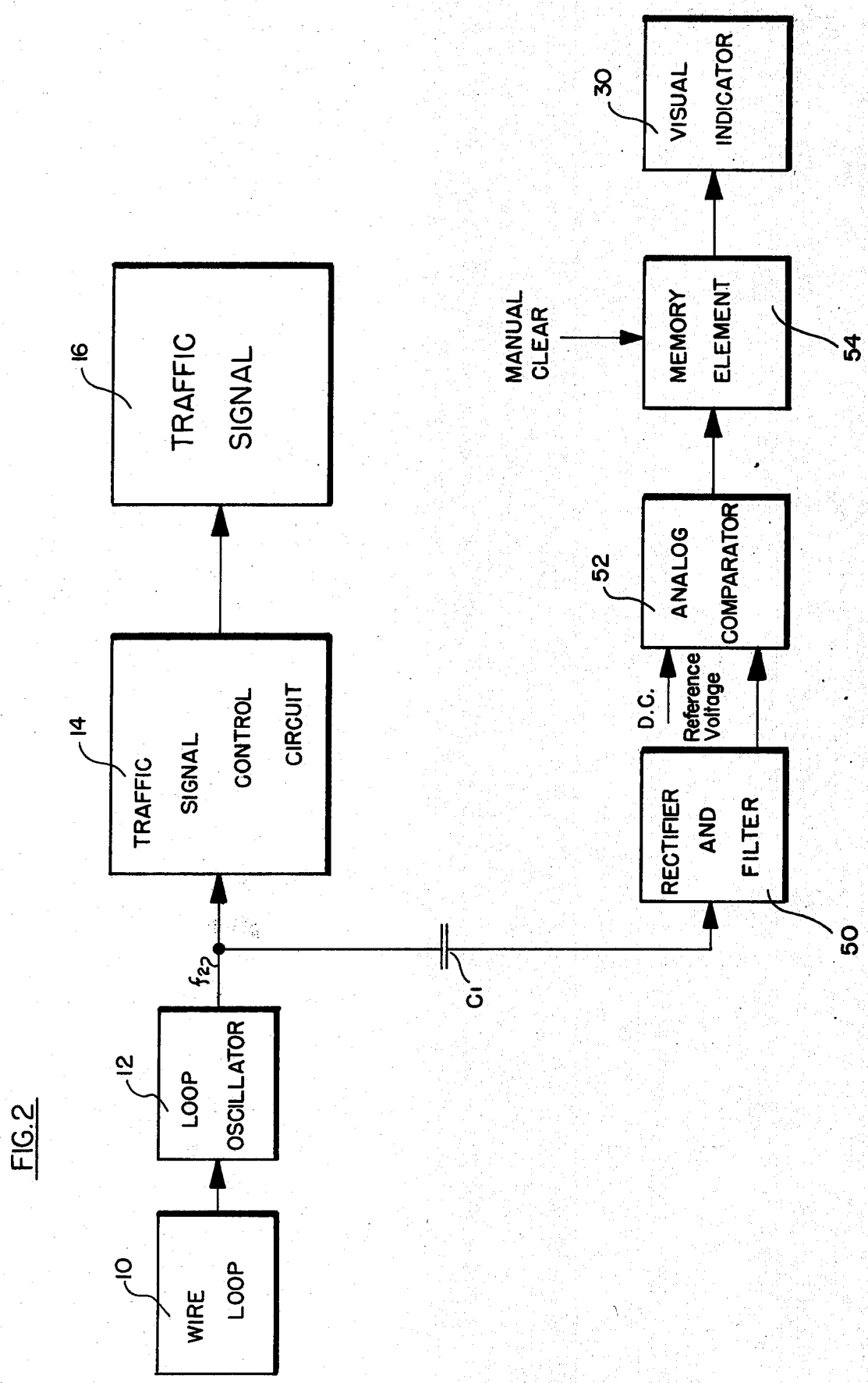

TRAFFIC SIGNAL LOOP MONITORING SYSTEM

BACKGROUND OF THE INVENTION

In any vehicle sensing system of the type under consideration, there are two basic components. These are a wire loop, which is embedded in the roadway, and an electronic control circuit which is connected to the loop, and which responds to changes in the inductance of the loop to sense the presence of vehicles in the roadway. The control circuit serves to operate an appropriate traffic signal. When a failure occurs in such a system, it is normally difficult to determine whether the failure occurred in the circuit of the embedded loop, or in the control circuit. The monitoring system of the present invention provides an instant indication in the event of such a failure, as to whether or not the failure occurred in the loop circuit.

The monitoring system of the invention finds particular, although not exclusive, utility in conjunction with vehicle detection systems of the type described and claimed in copending applications Ser. Nos. 364,442 and 443,299, both of which were filed in the name of the present inventor and which have now issued as U.S. Pat. Nos. 3,875,555 and 3,873,964. In the systems described in the copending applications, an embedded loop and lead-in circuit controls a loop oscillator which must function continuously under normal conditions. In such systems, should the loop oscillator cease oscillating, a failure condition exists which can usually be assumed to be in the loop or in its lead-in circuit. The system of the present invention senses the loop signal output of he loop oscillator, and it serves to indicate a failure condition in the loop or lead-in circuit if, for any reason, the loop oscillator ceases to oscillate.

BRIEF DESCRIPTION OF THE DRAWINGS

FIG. 2 is a block diagram of a traffic control system and monitoring unit representing an analog approach.

DETAILED DESCRIPTION OF THE ILLUSTRATED EMBODIMENT

Figure 1:
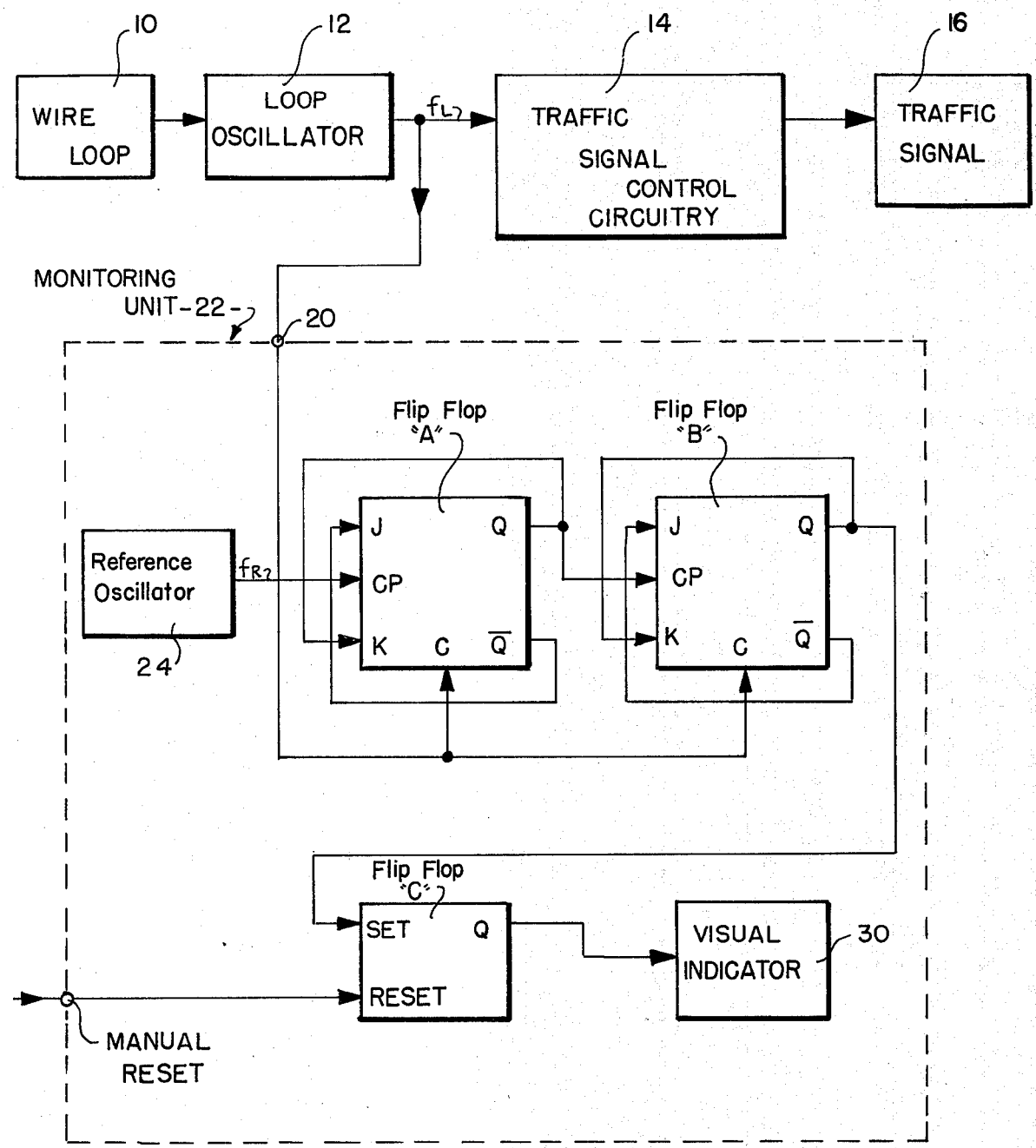
FIG. 1 is a block diagram of a typical traffic signal control system, and of a monitoring unit for the control system which incorporates a system which embodies the concepts of the present invention, in one of its aspects, representing a digital approach.

In the block diagram of FIG. 1, the wire loop which is embedded in the roadway is designated by the block 10, and it is connected to a usual loop oscillator 12 through an appropriate lead-in circuit. As described in the copending applications referred to above, the frequency of the loop oscillator is controlled by the inductance of the wire loop 10, and by the inductance of lead-in circuit. The loop oscillator is controlled to generate a loop output signal having a frequency ($f_L$), and that signal is introduced to appropriate traffic signal control circuitry 14 which, in turn, controls a traffic signal 16. In a manner fully described in the copending applications, the frequency ($f_L$) of the loop output signal changes when a vehicle enters the field of the wire loop 10, and this frequency change is utilized in the control circuitry 14, to provide a control signal for the traffic signal 16.

In accordance with the teaching of the present invention, the output of the loop oscillator 12 is connected to an input terminal 20 of a monitoring unit 22, the monitoring unit being constructed to incorporate a system embodying the concepts of the invention. The monitoring unit 22 in the embodiment of FIG. 1 includes a pair of flip-flops designated A and B, the flip-flops being interconnected as a two-count binary counter.

The system incorporated into the monitoring unit 22 also includes a reference oscillator 24 which generates a reference signal having a frequency ($f_R$) which is always less than the frequency ($f_L$) of the loop signal output of oscillator 12. The reference signal from the reference oscillator 24 is applied to "clock" terminal of the flip-flop A to clock the two-count binary counter formed by the flip-flops A and B. Each successive cycle of the reference signal tends to cause the two-count counter of the flip-flops A and B to move from one count to the next.

However, the loop output signal ($f_L$) from loop oscillator 12 is applied to the "clear" terminals of the flip-flops A and B, so that both flip-flops are cleared for each successive cycle of the loop output signal. Since the frequency ($f_R$) of the reference signal is always less than the frequency ($f_L$) of the loop signal, so long as the loop oscillator 12 is operating, the counter formed by the flip-flops A and B can never be clocked beyond its first count. Therefore, flip-flop B remains in its reset state so long as the loop oscillator 12 is operating.

However, should a failure occur so that the loop oscillator 12 ceases to function, the reference oscillator 24 will then be able to step the counter to its second count, and thereby set the flip-flop B. As soon as the flip-flop B is set, it sets a flip-flop C, whose set input terminal is connected to the Q output terminal of flip-flop B. When the flip-flop C is set, a visual indicator 30, or other appropriate type of indicator is activated, so as to apprise the operator of the failure. The flip-flop C remains set, and the indicator 30 remains activated, until a manual reset signal is applied to the reset input terminal of the flip-flop C, or until the power is turned off.

The flip-flop C can be either an electronic type or a mechanical type. The mechanical type of flip-flop C would offer the added feature of being insensitive to power drop-outs.

The invention in the embodiment of FIG. 1 provides, therefore, a simple and straightforward system for monitoring the loop oscillator 12, and for providing an appropriate indication, whenever the loop oscillator 12 fails to function. In this way, in the event of a failure in the traffic control system the operator can determine immediately whether the failure was in the wire loop 10, and its associated circuitry, or in the traffic signal control circuitry 14.

In the embodiment of FIG. 2, elements similar to those of FIG. 1 have been represented by the same numbers. As mentioned above, the embodiment of FIG. 1 represents a digital approach and the embodiment of FIG. 2 represents an analog approach.

In the embodiment of FIG. 2, the loop output signal ($f_L$) is applied through a coupling capacitor C1 to a rectifier and filter network 50 whose output is introduced to an analog comparator 52. The output of the comparator is applied to a memory element 54 which, in turn, is connected to the visual indicator 30.

The circuits of the individual blocks in FIGS. 1 and 2 are, in themselves, well known and need not be shown or described in circuit detail in order to provide a full and complete description of the invention.

In the embodiment of FIG. 2, the loop signal ($f_L$) is coupled through the coupling capacitor C1 to the rectifier and filter 50. The capacitor C1 serves to prevent any direct current voltage from entering the rectifier. The output of the rectifier and filter 50 is a direct current voltage which is equivalent to the peak amplitude of the loop output signal ($f_L$). Normally, the direct current voltage is constant. However, should the loop oscillator 12 cease to operate, this voltage drops to zero.

The direct current output voltage from the rectifier and filter 50 is compared with a predetermined direct current reference voltage in comparator 52. Whenever the direct current output voltage drops below the value of the reference voltage, the memory element 54 is set and the visual indicator 30 is activated. The memory element may be subsequently cleared by a manual operation to de-activate the indicator 30 and reset the circuit.

As in the preceding embodiment, when a failure occurs, the embodiment of FIG. 2 also permits an operator to determine immediately whether or not the failure was in the circuit of the embedded loop.

It will be appreciated that although particular embodiments of the invention have been shown and described, modifications may be made. It is intended in the claims to cover the modifications which come within the spirit and scope of the invention.

What is claimed is:

1. A monitoring system for detecting a failure condition in an electrical network, said network including an inductive loop, a loop oscillator and a lead-in circuit connecting the inductive loop to the oscillator to cause the oscillator to generate a loop signal having a frequency ($f_L$) determined by the inductance of the loop and lead-in circuit, said monitoring system including: control circuit means connected to said loop oscillator and including a reference source and comparator means coupled to the reference source and to the output of the loop oscillator and responsive to the loop signal for producing an output signal having a first value in the presence of said loop signal and a second value in the absence of said loop signal.

2. The monitoring system of claim 1, in which said control circuit means comprises a reference oscillator for generating a reference signal having a frequency ($f_R$) which is less than the frequency ($f_L$) of the loop signal; a binary counter; first circuit means connecting the reference oscillator to the binary counter to cause the reference signal to clock the counter and tend to cause the counter to proceed from one count to the next for each successive cycle of the reference signal; second circuit means connecting the loop oscillator to the counter to cause the loop signal to clear the counter for each successive cycle of the loop signal; and output circuit means connected to the counter for normally producing said output signal at said first value, and for detecting when the counter proceeds beyond a predetermined count to produce said output signal at said second value.

3. The monitoring system defined in claim 2, in which the counter is a two-count counter; and in which said output circuit means detects when the counter proceeds beyond the one count.

4. The monitoring system defined in claim 3, in which said counter includes a first and second flip-flop interconnected with one another.

5. The monitoring system defined in claim 4, in which said output circuit means includes a third flip-flop which is connected to the second flip-flop and which is set when the second flip-flop is set.

6. The monitoring system defined in claim 5, in which said third flip-flop, when set, remains set until reset by a manual resetting means.

7. The monitoring system defined in claim 1, and which includes indicator means connected to said control circuit means to be activated when said output signal is at said second value.

8. The monitoring system defined in claim 6, and which includes indicator means connected to said third flip-flop to be activated when said third flip-flop is set.

9. The monitoring system defined in claim 1, in which said control circuit means comprises a rectifier circuit coupled to the output of said loop oscillator to produce a direct current output voltage having a value related to the peak amplitude of said loop signal; and signal comparator means for producing an output whenever the direct current output voltage falls below a predetermined reference voltage level.

10. The monitoring system defined in claim 9, and which includes a memory element coupled to the comparator to be set by the output of said comparator for producing said output signal at said second value.

11. The monitoring system defined in claim 9, and which includes indicator means connected to said memory element to be activated when said output signal is at said second value.

12. The monitoring system defined in claim 10, in which said memory element, when set, remains set until reset by a manual re-setting means.

* * * * *